(12) United States Patent
Eastty et al.

(10) Patent No.: US 6,476,752 B1
(45) Date of Patent: Nov. 5, 2002

(54) SIGNAL PROCESSING SYSTEM EMPLOYING TWO BIT TERNARY SIGNAL

(75) Inventors: Peter Charles Eastty, Eynsham; James Andrew Scott Angus, Clifton, both of (GB)

(73) Assignee: Sony United Kingdom Limited, Weybridge (GB)

( * ) Notice: Subject to any disclaimer, the term of this patent is extended or adjusted under 35 U.S.C. 154(b) by 0 days.

(21) Appl. No.: 09/565,619

(22) Filed: May 4, 2000

(30) Foreign Application Priority Data

May 6, 1999 (GB) ............................................. 9910523

(51) Int. Cl.[7] ............................ H03M 1/12; H03M 1/66
(52) U.S. Cl. ....................... 341/155; 341/144; 341/143; 381/117
(58) Field of Search .......................... 341/155, 57, 143; 381/117; 332/103; 375/247; 708/403

(56) References Cited

U.S. PATENT DOCUMENTS

| | | | |
|---|---|---|---|
| 4,314,370 A | 2/1982 | Figol | 375/247 |
| 4,999,799 A | 3/1991 | Tufts | 708/403 |
| 5,347,587 A | 9/1994 | Takahashi et al. | 381/117 |
| 5,534,827 A * | 7/1996 | Yamaji | 332/103 |
| 5,625,358 A | 4/1997 | Wilson et al. | 341/143 |
| 5,736,950 A | 4/1998 | Harris et al. | 341/143 |
| 5,760,722 A | 6/1998 | Harris et al. | 341/143 |
| 5,767,750 A | 6/1998 | Yamaji | 332/103 |
| 5,809,071 A * | 9/1998 | Kobayashi et al. | 375/229 |
| 5,841,386 A | 11/1998 | Leduc | 341/143 |
| 6,087,969 A | 7/2000 | Stockstad et al. | 341/143 |
| 6,331,828 B1 * | 12/2001 | Kawasaki | 341/83 |

FOREIGN PATENT DOCUMENTS

JP 410233634 A * 9/1998

* cited by examiner

Primary Examiner—Peguy JeanPierre
Assistant Examiner—Jean Bruner Jeanglaude
(74) Attorney, Agent, or Firm—Frommer Lawrence & Haug LLP; William S. Frommer; Glenn F. Savit (57) ABSTRACT

A signal processing system in which a differentially quantized digital signal is used, the digital signal having two bits which represent only three values, of which one value (10 or 01) is zero and the other two (11 and 00) values represent a positive value and a negative value respectively.

26 Claims, 4 Drawing Sheets

SIGNAL PROCESSING SYSTEM EMPLOYING TWO BIT TERNARY SIGNAL

BACKGROUND OF THE INVENTION

1. Field of the Invention

The present invention relates to a digital signal processor. A preferred embodiment of the invention relates to a digital audio signal processor. For convenience, reference will be made herein to audio signal processing, but the invention is not limited to audio signals.

2. Description of the Prior Art

It is well known to convert analogue signals to digital signals using differential quantization. In differential quantization a signal is sampled, and the difference between the value of a sample and a prediction of the value of the sample is quantized. The prediction may be the previous sample.

In general principle the difference can be quantized and represented by an m-bit signal where m is any integer, greater than or equal to one.

Common values of m in practice include 1, 8 and 16. Except for m=1, the differences are represented by signed numbers, e.g. 2's complement numbers. A 1-bit signal represents 2 signal levels. Greater numbers of bits represent greater numbers of levels. For example an 8 bit signal represents 256 levels.

A 1-bit digital audio signal processor has been proposed in for example GB-A-2 319 931. The processor includes Delta-Sigma Modulator (DSM) filter sections. A 1-bit digital signal processor produces a 1-bit output that contains an audio signal which is obscured by quantization noise to an unacceptable level. It is imperative that the noise spectrum is suitably shaped to place as much of the noise as possible outside the audio signal band. The noise is produced mainly by the quantization of the audio signal to 1-bit.

A DSM filter section is designed to suitably shape the noise to minimise the noise in the audio band. A DSM filter section typically includes, amongst other circuits, at least one multiplier and a quantizer. The multiplier forms the product of an n-bit coefficient and the 1-bit signal. The quantizer re-quantizes the product as a 1-bit signal. The other circuits of a DSM filter section typically include delay elements and adders.

Whilst processing a 1-bit signal involves difficult quantization noise shaping it has advantages of simplicity of hardware. A 1-bit multiplier for example is a relatively simple circuit. Furthermore a 1-bit signal processor has the known advantages of an inherently serial structure, and a phase response and distortion approaching that of a high quality analogue system whilst retaining the advantages of digital techniques.

It is desired to reduce quantization noise and yet retain the many benefits of a 1-bit signal processing system.

SUMMARY OF THE INVENTION

According to one aspect of the present invention, there is provided a digital signal processing system in which differentially quantized data is represented by a 2-bit digital signal representing only 3 levels of which one level is zero and the other 2 levels are more positive and more negative respectively than zero.

The provision of such a differentially quantized digital signal, referred to hereinafter as a "ternary signal", having 2 bits representing only 3 levels produces better signal to noise ratio than a 1-bit signal, making a DSM filter section easier to design for the purpose of noise shaping. Also with the 2 bit representation of the 3 levels, in a preferred embodiment, only a minimal modification needs to be made to the multiplier(s) and the quantizer of what is otherwise a DSM filter section of a 1-bit signal processor. The modification is very cost effective.

The three levels may be represented by 11 for a positive increment relative to zero, 00 for a negative increment relative to zero and 01 or 10 for zero. It will be noted that two signal lines of a 2-bit parallel bus carrying the two bits may be reversed without affecting the values represented by the ternary signal.

The ternary signal used in the present invention differs from a "conventional" 2 bit signal in that a conventional 2 bit signal represents four levels represented by 00, 01, 10, 11 respectively. The represented levels are either asymmetric with respect to zero or none of them represents zero per se. A signal processor using such a conventional 2 bit signal requires more gates than the ternary signal used in the present invention and is thus less cost effective than the present invention.

According to another aspect of the invention, there is provided a signal processing system comprising a plurality of Delta Sigma Modulators (DSMs) in cascade, at least one of the DSMs being arranged to receive an r bit signal and to output a q bit signal, where at least one of r and q is a ternary signal having two bits which represent only three values, of which one value is zero, and the other two values represent a positive value and a negative value respectively.

The ternary signal reduces high frequency noise, allowing the design of cascaded DSMs to be simpler because noise induced instability is reduced.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 1:
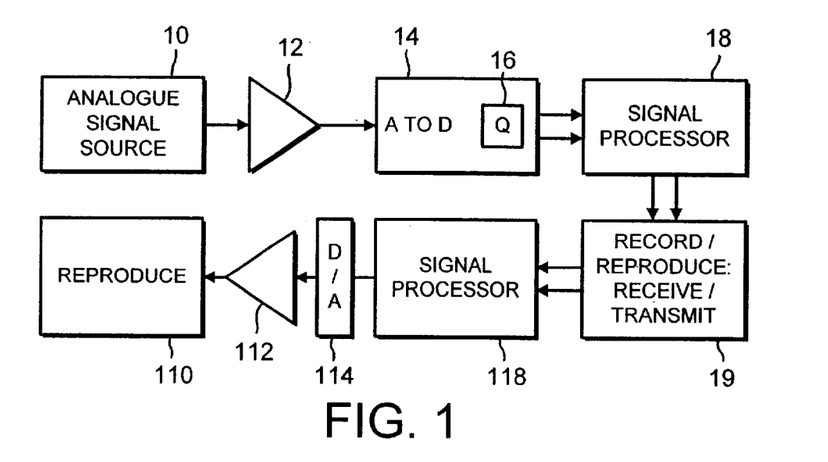
FIG. 1 is a block diagram of an audio signal processing system incorporating an embodiment of the present invention.

Referring to FIG. 1 an analogue signal source, in this example, a microphone 10, produces an analogue audio signal which may be amplified and/or level adjusted in an amplifier 12 to produce a signal whose level matches that of an Analogue to Digital (A/D) converter 14.

Figure 2:
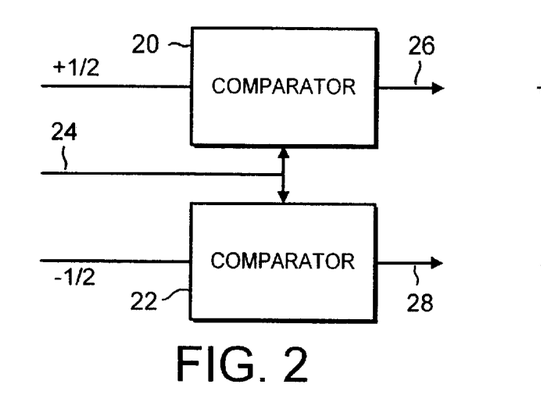
FIG. 2 is a schematic block diagram of a quantizer of an analogue to digital converter of the system of FIG. 1.

The A/D converter 14 is a Sigma-Delta converter which samples the analogue signal and produces a digital signal representing the difference between the value of a sample and a prediction of the value of the sample. The principles of operation of Sigma Delta Converters are well known and the converter 14 therefore does not require detailed explanation. In accordance with the embodiment of the invention of FIG. 1, the converter 15 includes a quantizer 16 (an example of which is shown in more detail in FIG. 2) which produces a 2-bit signal representing only three analogue signal levels as follows:

| DIGITAL | ANALOGUE |
|---------|----------|
| 11 | +1 |
| 10 or 01 | 0 |
| 00 | −1 |

The 2-bit signal is thus a ternary signal and is referred to as a ternary signal hereinafter. Because the ternary signal represents differences between sample values and predictions, the levels +1, 0, −1 may also be regarded as step changes in value.

The ternary signal at the output of the converter 14 is a 2-bit parallel signal on two signal lines.

The ternary signal is fed to a signal processor 18. The signal processor may include an equaliser which adjusts the amplitude/frequency characteristics of the audio signal. The signal processor 18 may be an audio mixer. The signal processor 18 may adjust the dynamics of the audio signal. For any of these functions, this example of the processor 18 comprises DSM filter sections. Examples of DSM filter sections are shown in more detail in FIGS. 4 to 8.

The processed ternary signal may be provided to a recording device such as an optical disc recorder or tape recorder, or may be provided to a transmission channel, as indicated by the block 19.

The ternary signal may be received from the transmission channel or reproduced from the recording device and fed to another processor 118 which may be similar to processor 18. To reproduce the analogue audio signal, the processed ternary signal is converted to analogue in a digital to analogue converter 114, amplified by an amplifier 112 and, for example, reproduced by a loud speaker 110.

It will be noted that the ternary signal is fed from each of the functional blocks 14, 18, 19, 118, 114 to the next block via a 2 bit parallel bus.

Referring to FIG. 2, an example of the quantizer 16 is shown.

The quantizer comprises first and second comparaters 20, 22. The analogue signal is fed to each comparator via an input 24. The first comparator 20 compares the value of the analogue signal with a reference value of +½. If the value of analogue signal exceeds (is more positive than) +½ the first comparator 20 outputs logic 1, otherwise it outputs logic 0. The second comparator compares the value of the analogue signal with a reference value −½. If the value of the analogue signal exceeds (is more positive than) −½ the second comparator outputs logic 1, otherwise it outputs logic 0.

Figure 3:
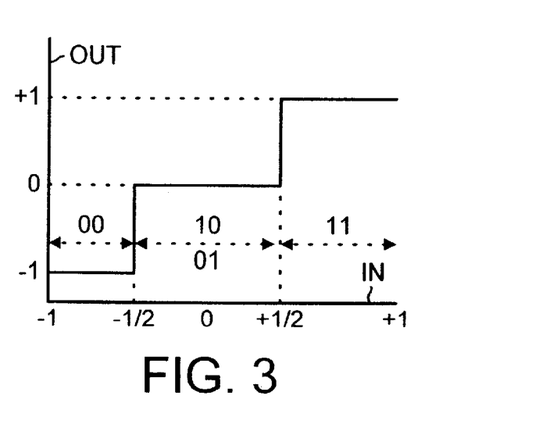
FIG. 3 is a diagram explaining the quantization of an analogue signal.

Thus as shown in FIG. 3, a 2-bit ternary signal is produced according to the following table.

| | Input | Output | |
|---|---|---|---|
| Nominal Value | Analogue Signal Value $x$ | First Comparator | Second Comparator |
| −1 | $x < -½$ | 0 | 0 |
| 0 | $-½ < x < +½$ | 0 | 1 |
| +1 | $x > +½$ | 1 | 1 |

The 2-bit ternary signal has no sign bits. It has a value 01 (or 10) which represents no change between successive signal samples. It is symmetrical in the sense that 00 and 11 represent equal increments each side of zero, and that there are equal numbers (one) of levels each side of zero. It should be noted that the ternary signal is insensitive to reversal of the 2 signal lines. Because −1 is represented by 00 and +1 by 11, reversing the signal lines does not alter the value of the signal. As will become apparent, the value of 0 is represented equally by 01 and 10, so again reversing the signal lines does not alter the value of the signal.

The ternary signal has other advantages. Compared to a 1-bit signal it has a better signal to noise ratio and it has less high frequency quantization noise, making the design of the filter sections of the processor 18 simpler whilst retaining the advantages of a 1-bit signal with minimal extra hardware cost, as will become apparent. The reduced high frequency noise makes cascading of filters simpler. Compared to a 2-bit signal representing 4 levels it has the advantage of lower hardware cost.

Figure 4:
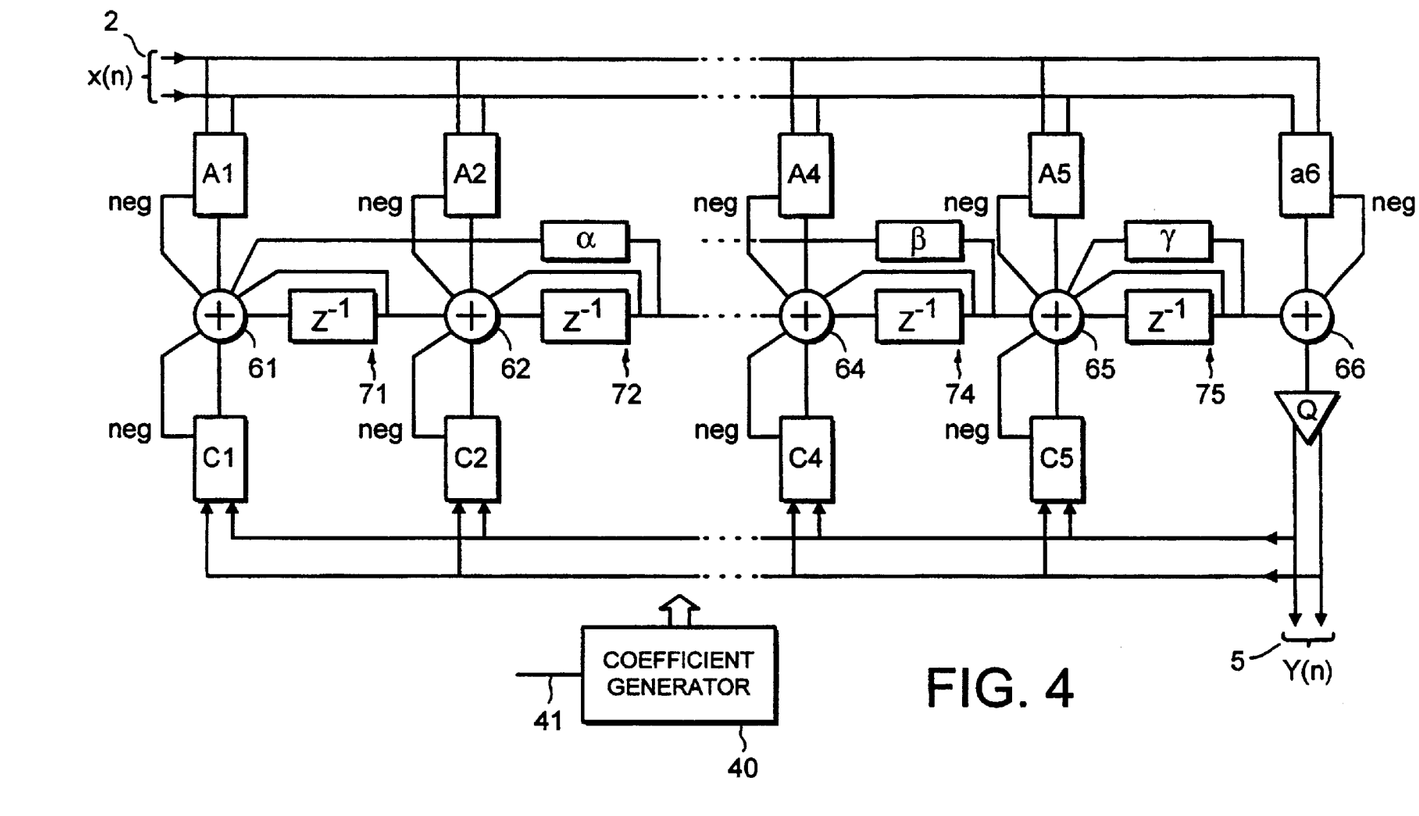
FIG. 4 is a schematic block diagram of an example of a DSM filter section.

FIG. 4 is a block diagram of an example of a generalised mth order filter section which may be used in the processor 18 or 118. The filter section has a two-bit parallel input bus 2 for the input ternary signal x(n), and a two bit parallel output bus 5 for the output, processed ternary signal Y(n). The order m of the filter may be one or greater.

The filter section comprises m integrator sections and a final section. Bits are clocked through the filter section by known clocking arrangements (not shown).

Figure 7:
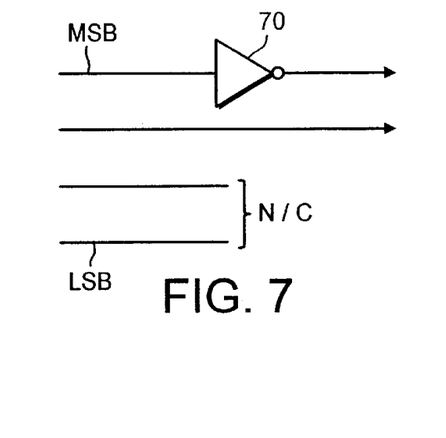
FIG. 7 is a block diagram of a quantizer of the DSM of FIG. 4 or 5.

The output signal Y(n) is produced by a quantizer Q in the final stage. An example of the quantizer Q is shown in FIG. 7. The quantizer Q requantizes the n-bit signal at its input as the ternary signal

| +1 | 11 |
| 0 | 01 or 10 |
| −1 | 00 |

Figure 6:
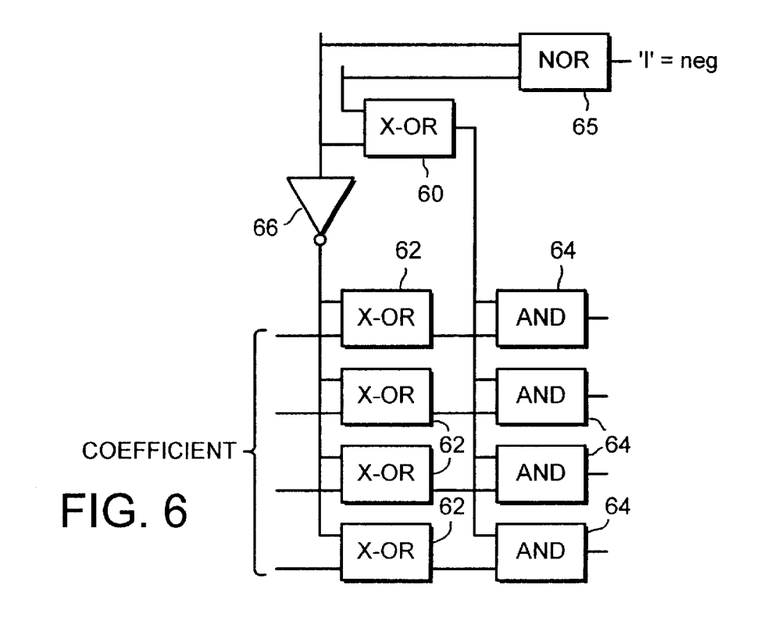
FIG. 6 is a block diagram of a multiplier of the DSM of FIG. 4 or 5.

The integrator sections include multipliers A1 to A6 and C1 to C6. An example of a suitable multiplier is shown in FIG. 6.

The first integrator section comprises a first coefficient multiplier A1 connected to the input 2, a second coefficient multiplier C1 connected to the output 5 of the quantizer Q, an adder 61 which sums the outputs of the multipliers A1 and C1 and an integrator 71 which integrates the output of the adder 61. The integrator has a delay of 1 sample period. The coefficient multipliers A1, C1 multiply the ternary signals by p-bit coefficients A1 and C1.

Each of the m−1 intermediate integrator sections likewise comprises a first coefficient multiplier A2 . . . A5 connected to the input 2, a second coefficient multiplier C2 . . . C5 connected to the quantizer Q, an adder 62 . . . 65 and an integrator 72 . . . 75. Each of the adders 62 to 65 receives the output of the integrator of the preceding stage in addition to the outputs of the coefficient multipliers A and C.

The final section comprises a coefficient multiplier A6 connected directly to the input 2, an adder 66, and the quantizer Q. The adder 66 is connected to the output of the delay element of the integrator 75 of the preceding stage, and to the multiplier A6.

The illustrative filter section of FIG. 4 also comprises feedback multipliers α, β, γ.

Multiplier α multiples the output of the integrator 72 by a coefficient α and feeds the product back to adder 61. Multiplier β multiplies the output of integrator 74 by a coefficient β and feeds the product back to adder 64. Multiplier γ multiplies the output of integrator 75 by a coefficient γ and feeds the product back to adder 65.

The multipliers, α, β, γ allow the filter section to provide for example a Chebyschev characteristic. They may be omitted if another characteristic is required.

The coefficients A1 to A6, C1 to C6 and α, β, γ may all be fixed to provide a fixed filter characteristic.

Coefficients A1 to A6 control the gain of the filter section and may be variable. If coefficients A1 to A6 are variable, a coefficient generator 40 is provided to control them in accordance with a control signal 41. The generator 40 may comprise a microcomputer. For the purposes of the following description is it assumed that the multipliers α, β and γ are omitted.

Figure 5:
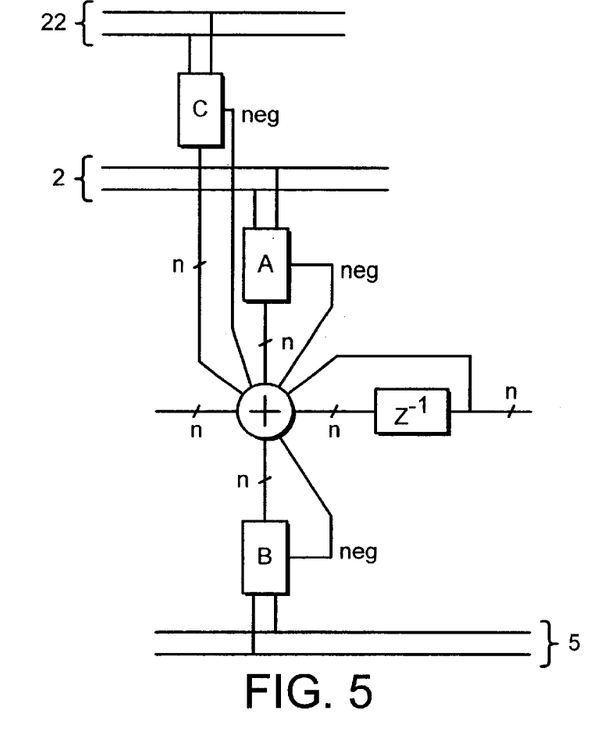
FIG. 5 is a schematic block diagram of a modification of the DSM of FIG. 4 for use as a mixer.

The filter section of FIG. 4 may be modified to operate as a signal mixer. Referring to FIG. 5, which shows one of the intermediate sections, each of the integrator sections and the final section has, in addition to its multiplier A (which is connected to input 2 for receiving a first ternary audio signal), an additional multiplier B connected to another input 22 for receiving a second ternary audio signal to be mixed with the first audio signal. Multiplier B is connected to the adder 6 of the section.

The multipliers A and B multiply the first and second audio signals by coefficients A and B to perform signal mixing. The coefficients A and B are preferably variable to perform variable mixing.

The coefficients A1 to A6, and the coefficients C1 to C6 and, if provided, the coefficients B, and/or α, β, γ may be chosen by methods known in the art, to provide a desired audio signal processing characteristic. The coefficients must also be chosen to shape the quantization noise to minimise it in the frequency band of the audio signal.

For example, the coefficients A and C, and B if provided, may be chosen by:

a) finding the Z-transform H(z) of the desired filter characteristic—e.g. noise shaping function; and b) transforming H(z) to coefficients.

This may be done by the methods described in the papers "Theory and Practical Implementation of a Fifth Order Sigma-Delta A/D Converter, Journal of Audio Engineering Society, Volume 39, no. 7/8, 1991 July/August by R. W Adams et al."

and using the knowledge of those skilled in the art. One way of calculating the coefficients A and C is outlined in the accompanying Annex A.

The multipliers A, B, C multiply the two bit ternary signal by an n-bit coefficient where n>2 to produce an n-bit number. The adders 6 are suitable n-bit adders, known in the art. The delay elements $Z^{-1}$ are also suitable elements known in the art.

An example of a circuit suitable as a multiplier A, B or C is shown in FIG. 6. It is assumed that the coefficients are n-bit 2's complement numbers. The multiplier multiplies the 2-bit ternary signal by the n-bit coefficient.

The 2-bit ternary signal represents +1, 0, −1. If the coefficient is N, the product of the multiplier is +N, 0 or −N, depending on the value of the ternary signal.

FIG. 6 shows, by way of example, a 4 bit multiplier. To multiply the 4 bit 2's complement number N by the ternary signal it is noted that if the ternary signal is 01 or 10 representing 0, the output is 0. If the ternary signal is 11 representing +1 the output is the coefficient N unchanged. If the ternary signal is 00 representing −1, the output is the coefficient inverted in sign.

The multiplier comprises n Exclusive −OR gates 62, which receive respective bits of the coefficient N at first inputs. Second inputs of the gates 62 receive, in common, either one of the bits of the ternary signal, via an inverter 66.

The outputs of the n Exclusive −OR gates are connected to respective first inputs of n AND gates 64. The second inputs of the AND gates are connected, in common, to the output of an Exclusive −NOR gate 60 which receives the two bits of the ternary signal. The Exclusive −NOR gate 60 has the truth table:

| VALUE | INPUT | OUTPUT |
|---|---|---|
| −1 | 0 0 | 1 |
| 0 | 1 0 | 0 |
| 0 | 0 1 | 0 |
| +1 | 1 1 | 1 |

Thus if the ternary signal represent 0, (01, 10) the AND gates output all logic 0 regardless of the outputs of the Exclusive OR gates. 0000 is 2's complement representation for zero. If the ternary signal represents −1 (00) or +1 (11), the outputs of the AND gates 64 depend on the outputs of the Exclusive −OR gates 62.

An Exclusive OR gate has the truth table.

| VALUE | INPUT | OUTPUT |
|---|---|---|
| −1 | 0 0 | 0 |
| 0 | 1 0 | 1 |
| 0 | 0 1 | 1 |
| +1 | 1 1 | 0 |

If one input to the gate is logic 1, the output is the other input bit inverted. If one input to the gate is logic 0, the output is the other input bit unchanged.

Thus for a ternary signal 11, (+1) the inverter 66 inverts one of two the bits to zero. The outputs of the gates 62 are thus the bits of the coefficient N unchanged, i.e. a 2's complement number N.

For a ternary signal 00, (−1) the outputs of the gates 62 are the bits of the coefficient N inverted, producing a 1's complement number.

The 1's complement number may be regarded as a sufficient approximation to a 2's complement number. However, in a preferred embodiment of the invention it is converted to a true 2's complement number by adding '1' to it. Referring by way of example to FIG. 4 or 5, each section of a filter includes a p-bit adder 6. The occurrence of value 00 (−1) is detected in the multiplier of FIG. 7 by a NOR gate 65, which produces logic '1' in response to 00 (−1). Logic '1' produced by the NOR gate 65 thus indicates the presence of decimal −1 referred to as "neg" in FIG. 4 or 5. The output '1' of the NOR gate is provided to a carry input of the adder 6 of the stage of FIG. 5. For the DSM of FIG. 4 or 5, it is assumed all the multipliers A, B and C operate on a ternary signal and produce a 1's complement number in response to 00 (−1), together with the 'neg' signal and the associated adder converts the 1's complement number to 2's complement.

FIG. 7 is an example of the quantizer Q of FIG. 4. The quantizer receives at its input for example a 4-bit 2's complement positive number. For 2's complement positive numbers, including zero, the MSB is always zero, and for 2's complement negative numbers the MSB is always 1.

For values +4 to +7 the next MSB is one, whilst for values 0 to +3 the next MSB is zero. For values −1 to −3 the next MSB is one and for values −4 to −8 the next MSB is zero.

Thus the quantizer comprises two signal lines connected to receive the MSB and the next MSB and an inverter which inverts the MSB of the 2's complement number. The other bits of the 4-bit number are not connected (N/C).

| Value | MSB | Next MSB | Quantized | Value |
|---|---|---|---|---|
| +4—+7 | 0 | 1 | 11 | +1 |
| +3—0 | 0 | 0 | 10 | 0 |
| −1—−3 | 1 | 1 | 01 | 0 |
| −3—−8 | 1 | 0 | 00 | −1 |

The digital to analogue converter 114 of the example of FIG. 1 receives a 2-bit ternary signal and converts it to an analogue signal. However, the converter 114 may receive a 1-bit signal as will become apparent from the following discussion of other illustrative embodiments of the invention as shown in FIGS. 8 and 9.

Figure 8:
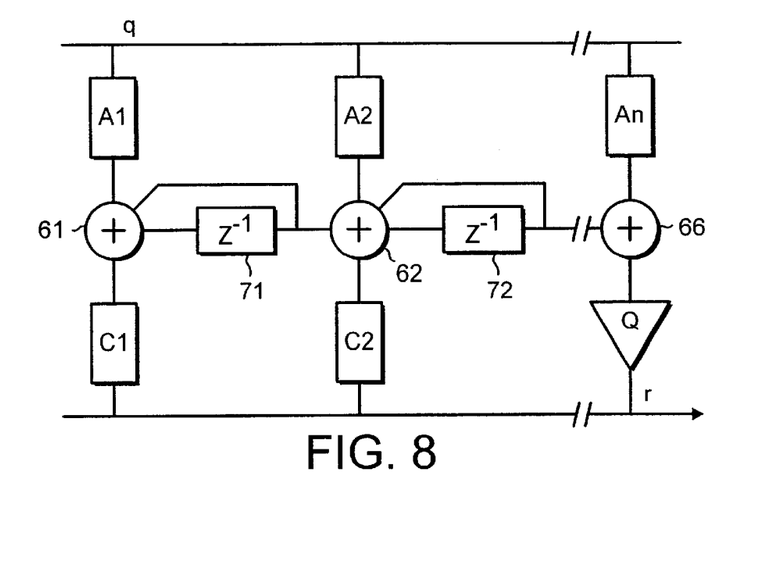
FIG. 8 is a block diagram of an example of a DSM.

FIG. 8 shows a DSM which is a simplified version of the DSM of FIG. 4. It comprises an input for receiving a q bit signal, a Quantiser Q which outputs an r bit signal, and a plurality of sections. A more detailed description is given with reference to FIG. 4.

The q-bit input signal may be a 1-bit signal and the r-bit output signal may be a ternary signal in accordance with the present invention. Alternatively, the q-bit input signal may be a ternary signal and the r bit output signal a 1-bit signal. As another alternative both may be ternary signals as described with reference to FIG. 4. The input and output signals may have different forms because they are independent: they are both converted by the adders and multipliers to n-bit two's complement numbers before being combined in the adders of the stages of the DSM. The r bit output signal is dependent on the choice of the quantiser Q.

Figure 9:
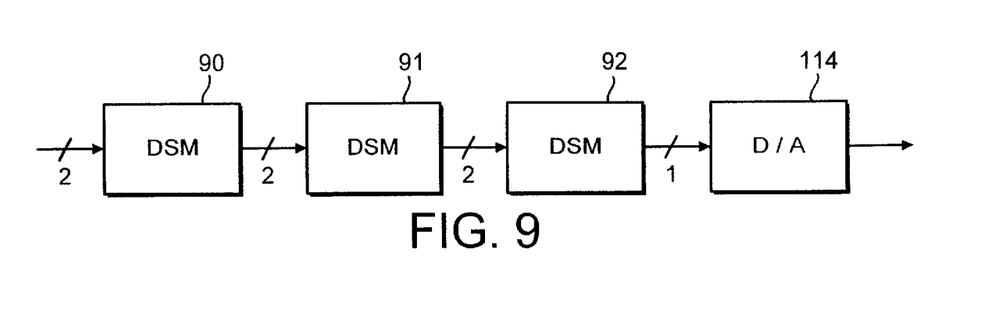
FIG. 9 is a block diagram of cascaded DSMs.

FIG. 9 shows a plurality of DSMs, 90, 91, 92 cascaded, i.e. connected in series. The final DSM 92 is connected to a D/A converter 114. In the example of FIG. 9 the final DSM receives a ternary signal and outputs a 1-bit signal to the converter 114. The preceding DSMs 90 and 91 receive and output ternary signals for this example. The first DSM 90 could receive a 1-bit signal and output a ternary signal as one example of a modification. The use of a ternary signal in the cascaded DSMs reduces problems of instability due to build up of noise, because the HF noise content is reduced compared to a 1-bit signal.

Although embodiments of the invention have been described by way of example with reference to 4 bit coefficients, the invention is not limited to 4-bit coefficients. The coefficients may have any suitable number, of bits greater than 1, preferably much greater than 1.

The filter sections of FIGS. 4, 5 and 8 are illustrative. Other sorts of filter sections having a different structure may be used. Many other structures of DSM filter sections are known in the art and are within the scope of the present invention.

The source of the signals may be any suitable analogue signal source. For the example of audio signals, the source may be an analogue disc or tape record.

The invention is not limited to audio signals.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

CALCULATING COEFFICIENTS

This annex outlines a procedure for analysing a fifth order DSM and for calculating coefficients of a desired filter characteristic.

A fifth order DSM is shown in Figure A having coefficients a to f and A to E, adders 6 and integrators 7. Integrators 7 each provide a unit delay. The outputs of the integrators are denoted from left to right s to w. The input to the DSM is a signal x[n] where [n] denotes a sample in a clocked sequence of samples. The input to the quantizer Q is denoted y[n] which is also the output signal of the DSM. The analysis is based on a model of operation which assumes quantizer Q is simply an adder which adds random noise to the processed signal. The quantizer is therefore ignored in this analysis.

The signal y[n]=fx[n]+w[n] i.e. output signal y[n] at sample [n] is the input signal x[n] multiplied by coefficient f plus the output w[n] of the preceding integrator 7.

Applying the same principles to each output signal of the integrators 7 results in Equations set 1.

$$y[n]=fx[n]+w[n]$$

$$w[n]=w[n-1]+ex[n-1]+Ey[n-1]+v[n-1]$$

$$v[n]=v[n-1]+dx[n-1]+Dy[n-1]+u[n-1]$$

$$u[n]=u[n-1]+cx[n-1]+Cy[n-1]+t[n-1]$$

$$t[n]=t[n-1]+bx[n-1]+By[n-1]+s[n-1]$$

$$s[n]=s[n-1]+ax[n-1]+Ay[n-1]$$

These equations are transformed into z-transform equations as well known in the art resulting in equations set 2.

$$Y(z)=fX(z)+W(z)$$

$$W(z)(1-z^{-1})=z^{-1}(eX(z)+EY(z)+V(z))$$

$$V(z)(1-z^{-1})=z^{-1}(dX(z)+DY(z)+U(z))$$

$$U(z)(1-z^{-1})=z^{-1}(cX(z)+CY(z)+T(z))$$

$$T(z)(1-z^{-1})=z^{-1}(bX(z)+BY(z)+S(z))$$

$$S(z)(1-z^{-1})=z^{-1}(aX(z)+AY(z))$$

The z transform equations can be solved to derive Y(z) as a single function of X(z) (Equation 3)

$$Y(z) = fX(z) + \frac{z^{-1}}{(1-z^{-1})}\Big(eX(z) + EY(z) +$$

-continued $$\frac{z^{-1}}{1-z^{-1}}\left(dX(z)+DY(z)+\frac{z^{-1}}{1-z^{-1}}\left(cX(z)+CY(z)+\frac{z^{-1}}{1-z^{-1}}\right.\right.$$
$$\left.\left.\left(bX(z)+BY(z)+\frac{z^{-1}}{1-z^{-1}}(aX(z)+AY(z))\right)\right)\right)$$

This may be reexpressed as shown in the right hand side of the following equation, Equation 4. A desired transfer function of the DSM can be expressed in series form $$\frac{Y(z)}{X(z)}$$

given in left hand side of the following equation and equated with the right hand side in Equation 4.

$$\frac{Y(z)}{X(z)} = \frac{\alpha_0 + \alpha_1 z^{-1} + \alpha_2 z^{-2} + \alpha_3 z^{-3} + \alpha_4 z^{-4} + \alpha_5 z^{-5}}{\beta_0 + \beta_1 z^{-1} + \beta_2 z^{-2} + \beta_3 z^{-3} + \beta_4 z^{-4} + \beta_5 z^{-5}}$$

$$= \frac{\left(\begin{array}{l}f(1-z^{-1})^5 + z^{-1}e(1-z^{-1})^4 + z^{-2}d(1-z^{-1})^3 + \\ z^{-3}c(1-z^{-1})^2 + z^{-4}b(1-z^{-1}) + z^{-5}a\end{array}\right)}{\left(\begin{array}{l}(1-z^{-1})^5 - z^{-1}E(1-z^{-1})^4 - z^{-2}D(1-x^{-1})^3 - \\ z^{-3}C(1-z^{-1})^2 - z^{-4}B(1-z^{-1}) - Z^{-5}A\end{array}\right)}$$

Equation 4 can be solved to derive the coefficients f to a from the coefficients $\alpha_0$ to $\alpha_5$ and coefficients E to A from the coefficients $\beta_0$ to $\beta_5$ as follows noting that the coefficients $\alpha_n$ and $\beta_n$ are chosen in known manner to provide a desired transfer function.

f is the only $z^0$ term in the numerator. Therefore $f=\alpha_0$.

The term $\alpha_0(1-z^{-1})^5$ is then subtracted from the left hand numerator resulting in $$\alpha_0 + \alpha_1 z^{-1} \ldots + \ldots \alpha_5 z^{-5} - \alpha_0(1-z^{-1})^5$$

which is recalculated.

Similarly $f(1-z^{-1})^5$ is subtracted from the right hand numerator. Then e is the only $z^{-1}$ term and can be equated with the corresponding $\alpha_1$ in the recalculated left hand numerator.

The process is repeated for all the terms in the numerator.

The process is repeated for all the terms in the denumerator.

We claim:

1. A signal processing system in which a differentially quantized digital signal is used, said digital signal being a ternary signal having a two bit combination which represents one of only three values, in which the particular value represented depends on the two bits of the combination, of which one value is zero and the other two values represent a positive value and a negative value respectively.

2. A system according to claim 1, wherein said positive and negative values are symmetrical with respect to zero.

3. A system according to claim 1, wherein said two bit combination of the ternary signal is either bits 00, 01, 10 or 11 and wherein said bits 11 of the ternary signal represent said positive value, said bits 00 of the ternary signal represent said negative value and said bits 01 or 10 of the ternary signal represent zero.

4. A system according to claim 1, wherein said positive value represents decimal +1, and said negative value represents decimal −1.

5. A digital signal processing system according to claim 1, which is a digital audio signal processing system.

6. A signal processing system in which a differentially quantized digital signal is used, said digital signal being a ternary signal having two bits which represent only three values, of which one value is zero and the other two values represent a positive value and a negative value respectively, said system including a quantizer having:

an input for receiving an analogue signal;

first and second outputs; and first and second comparators having respective outputs coupled to said first and second outputs, respective first inputs each coupled to said input for receiving said analogue signal, and respective second inputs one receiving a reference level of half said positive value, and the other receiving a reference level of half said negative value, each comparator producing a binary indication of whether said analogue signal is more positive or more negative than the reference level applied to its second input, thereby to produce said ternary signal.

7. A system according to claim 1, having an input for receiving said two bits of said ternary signal in parallel and a signal processor for processing said ternary signal.

8. A system according to claim 7, wherein said processor comprises a Delta Sigma Modulator.

9. A system according to claim 7, wherein said processor comprises a coefficient multiplier for multiplying said ternary signal by an n-bit coefficient where n is greater than one to produce an n bit product.

10. A system according to claim 9, wherein said processor comprises a requantiser for requantising said n-bit product.

11. A system according to claim 10, wherein said requantiser requantises the n-bit product as a 1-bit signal.

12. A system according to claim 10, wherein said requantiser requantises said n-bit product as a ternary signal.

13. A signal processing system in which a differentially quantized digital signal is used, said digital signal being a ternary signal having two bits which represent only three values, of which one value is zero and the other two values represent a positive value and a negative value respectively;

the system having an input for receiving said two bits of said ternary signal in parallel and a signal processor for processing said ternary signal;

wherein said signal processor comprises a coefficient multiplier for multiplying said ternary signal by an n-bit coefficient, where n is greater than one, to produce an n bit product; and a requantiser for requantising said n-bit product as a ternary signal; and said requantizer selects the two most significant bits of said n bit signal product and inverts the most significant of said selected bits.

14. A signal processing system in which a differentially quantized digital signal is used, said digital signal being a ternary signal having two bits which represent only three values, of which one value is zero and the other two values represent a positive value and a negative value respectively, the system having an input for receiving said two bits of said ternary signal in parallel and a signal processor for processing said ternary signal;

wherein said signal processor comprises a coefficient multiplier for multiplying said ternary signal by an n-bit coefficient where n is greater than one to produce an n bit product; and, said multiplier comprises, for each of said n bits of said coefficient, an Exclusive −OR gate having a first input for receiving said bit of said coefficient and a second input for receiving one of said bits of said ternary signal, and an AND gate having a first input for receiving the output of said Exclusive −OR gate and a second input for receiving an Exclusive −NOR combination of said two bits of said ternary signal.

15. A system according to claim 14, wherein said processor further comprises a NOR gate for forming a NOR combination of said two bits of said ternary signal to detect bits 00, and an adder which adds the output of said NOR gate to the output of said multiplier.

16. A signal processing system comprising a plurality of Delta Sigma Modulators (DSMs) in cascade, at least one of the DSMs being arranged to receive an r bit signal and to output a q bit signal, where at least one of r and q is a ternary signal having a two bit combination which represents one of only three values, in which the particular value represented depends on the two bits of the combination, of which one value is zero, and the other two values represent a positive and a negative value respectively.

17. A system according to claim 16, wherein said two bit combination of the ternary signal is either bits 00, 01, 10 or 11 and wherein said bits 11 of the ternary signal represent said positive value, said bits 00 of the ternary signal represent said negative value and said bits 01 or 10 of the ternary signal represent zero.

18. A system according to claim 16, wherein said positive value represents decimal +1, and said negative value represents decimal −1.

19. A system according to claim 16, wherein said r bit signal is said ternary signal and said q bit signal is a 1-bit signal.

20. A system according to claim 16, wherein said r bit signal is a 1-bit signal and said q-bit signal is said ternary signal.

21. A system according to claim 16, wherein said positive and negative values are symmetrical with respect to zero.

22. A digital signal processing system according to claim 16, which is a digital audio signal processing system.

23. Recording apparatus for recording an input analog signal on a recording medium in digital form, comprising:

an analog to digital (A/D) converter for converting the input analog signal into a differentially quantized digital signal, said digital signal being a ternary signal having two bits which together represent only three values, of which one value is zero and the other two values represent a positive value and a negative value, respectively; and, recording means for recording the ternary signal on the recording medium.

24. Recording apparatus according to claim 23, further comprising a signal processor coupled between said A/D converter and said recording means, for processing said ternary signal prior to the recording thereof by said recording means.

25. Reproduction apparatus comprising:

reproduction means for reproducing, from a recording medium, a ternary signal having two bits which together represent only three values, of which one value is zero and the other two values represent a positive value and a negative value, respectively, said ternary signal having been derived from an analog signal via differential quantization; and, a digital to analog (D/A) converter for converting said reproduced ternary signal to analog form to reproduce said analog signal for output.

26. Reproduction apparatus according to claim 25, further comprising a signal processor coupled between said reproduction means and said D/A converter, for processing said ternary signal prior to the D/A conversion thereof.

* * * * *